United States Patent [19]

Galani et al.

[11] Patent Number: 4,510,463
[45] Date of Patent: Apr. 9, 1985

[54] AUTOMATIC GAIN CONTROLLED FREQUENCY DISCRIMINATOR FOR USE IN A PHASE LOCKED LOOP

[75] Inventors: Zvi Galani, Bedford; Raymond C. Waterman, Jr., Westford, both of Mass.

[73] Assignee: Raytheon Company, Lexington, Mass.

[21] Appl. No.: 487,778

[22] Filed: Apr. 22, 1983

[51] Int. Cl.³ .............................................. H03L 7/02
[52] U.S. Cl. ........................................ 331/15; 331/25; 331/40; 331/41; 328/133; 343/5 AF
[58] Field of Search ................ 328/133, 155; 331/15, 331/18, 25, 30, 32, 34, 40, 41; 343/5 AF

[56] References Cited

U.S. PATENT DOCUMENTS

| | | | |
|---|---|---|---|
| 3,593,181 | 7/1971 | Kuhn | 331/12 |
| 3,882,413 | 5/1975 | Healey | 331/25 X |
| 4,159,475 | 6/1979 | Andre et al. | 343/5 AF |
| 4,336,505 | 6/1982 | Meyer | 331/25 X |

FOREIGN PATENT DOCUMENTS 1424253 2/1976 United Kingdom ................. 331/25

Primary Examiner—Eugene R. Laroche
Assistant Examiner—W. R. Paxman
Attorney, Agent, or Firm—Philip J. McFarland; Joseph D. Pannone

[57] ABSTRACT

A frequency discriminator having a wide capture band is shown to comprise, in addition to a conventional phase detector having two channels fed by a signal whose frequency is to be determined (the first one of the channels containing a tuned circuit operative to shift the phase of the signal in accordance with the difference between the frequency of the signal and the center frequency of the tuned circuit and the second one of the channels containing a phase shifter operative to shift the phase of the signal by 90° regardless of the frequency of the signal), a compensating circuit operative substantially to equalize the amplitudes of the signals applied to the phase detector, the compensating circuit including an amplifier in the first one of the channels to amplify the signal out of the tuned circuit, the gain of the amplifier being controlled by a signal indicative of the difference between the amplitudes of the signals fed to the phase detector.

2 Claims, 3 Drawing Figures

AUTOMATIC GAIN CONTROLLED FREQUENCY DISCRIMINATOR FOR USE IN A PHASE LOCKED LOOP

BACKGROUND OF THE INVENTION

This invention pertains generally to frequency discriminators and particularly to circuitry of such type that is useful in a radar receiver wherein the frequency of an oscillator must be changed automatically to track the frequency of a received signal.

It is well known in the art to provide a frequency discriminator in an automatic frequency control (AFC) circuit in a radar receiver. Thus, many different AFC circuits have been designed on the idea that the frequency of a received signal relative to a known frequency may be determined to form a frequency control signal for an oscillator desired to be controlled. The signal out of the oscillator then may be used as the reference signal in a local oscillator to effect the desired automatic frequency control.

In the typical frequency discriminator used for the foregoing purpose, the received signal (or more precisely, the intermediate frequency analog of the received signal) is divided and passed through two channels wherein the difference between the phase shifts imparted on the divided parts of the received signal is related to the difference between the frequency of the received signal and a known frequency corresponding to the zero crossing of the discriminator. Therefore, by impressing the signals out of the two channels on a phase detector, a bipolar control signal may be produced to adjust the frequency of the oscillator until the bipolar control signal is nulled. Unfortunately, however, the inherent qualities of the phase shifting elements in the two channels cause the characteristic curve of any known frequency discriminator to assume the familiar "S" shape, which in turn means that, in addition to a desired frequency at which the bipolar control signal is properly nulled, there are so-called "image frequencies" at which the bipolar control signal may be improperly nulled.

In practice there are several other problems encountered when a conventional frequency discriminator is used in a frequency lock loop. Primary among these is the problem of spurious responses of the discriminator to out-of-band input signals. That is to say, because the characteristic curve of any known discriminator only approximates an "S" shape, (meaning that the discriminator may have spurious responses to in-band signals and may not be zero for all out-of-band signals) it is possible for the frequency lock loop to lock to one of such spurious responses. Thus, for example, if the spurious response were at, say, the 10 millivolt level and the discriminator were utilized in a frequency control loop having a gain of 100, then a bipolar control signal having a magnitude of 1 volt would be provided to the oscillator intended to be controlled. A control signal of such magnitude would be effective to tune the oscillator across an appreciable portion of its operating bandwidth with the unwanted result that a "lock" could be made on spurious response of the discriminator.

A second problem associated with the use of conventional frequency discriminators derives from the fact that any such discriminator is, per se, a narrowband element. This means that in many applications, where the frequency of a received signal may vary within a relatively wide band of frequencies, auxiliary means must be provided to attain a frequency lock on any received signal. The added complexity of any auxiliary means, along with the requirement that time be taken to search a relatively wide spectrum, is, to date, an accepted limitation of known frequency discriminators.

Still another problem associated with the use of conventional frequency discriminators derives from the fact that, with a phase detector as the sensing element, it is necessary that the amplitudes of the signals out of the two channels be substantially equal for optimum operation of the discriminator.

SUMMARY OF THE INVENTION

With the foregoing background of the invention in mind, it is a primary object of this invention to provide a frequency discriminator having a characteristic curve with a single zero cross-over.

It is another object of this invention to provide an improved frequency discriminator that will allow for automatic frequency acquisition over a relatively wide frequency range.

It is yet another object of this invention to provide an improved amplitude balance between the two arms of the discriminator.

The foregoing and other objects of this invention are generally attained by providing, in a radar receiver, a frequency discriminator in which a received signal is first divided to pass through two channels, such channels having phase shifting characteristics that differ in accordance with the frequency of the received signal and having amplifying characteristics that maintain substantial equality between the amplitudes of the signals out of the two channels regardless of the frequency of the received signal, with the signals out of the two channels then being impressed on a phase detector to produce a control signal for a voltage-controlled oscillator. In operation, then, the characteristic curve of the phase detector in the contemplated frequency discriminator differs from the S-shaped characteristic curve of a conventional frequency discriminator in that there is a single zero cross-over.

BRIEF DESCRIPTION OF THE DRAWINGS

For a more complete understanding of the invention reference is now made to the accompanying description of a preferred embodiment of this invention as illustrated in the accompanying drawings, in which.

DESCRIPTION OF THE PREFERRED EMBODIMENT

Figure 1A:
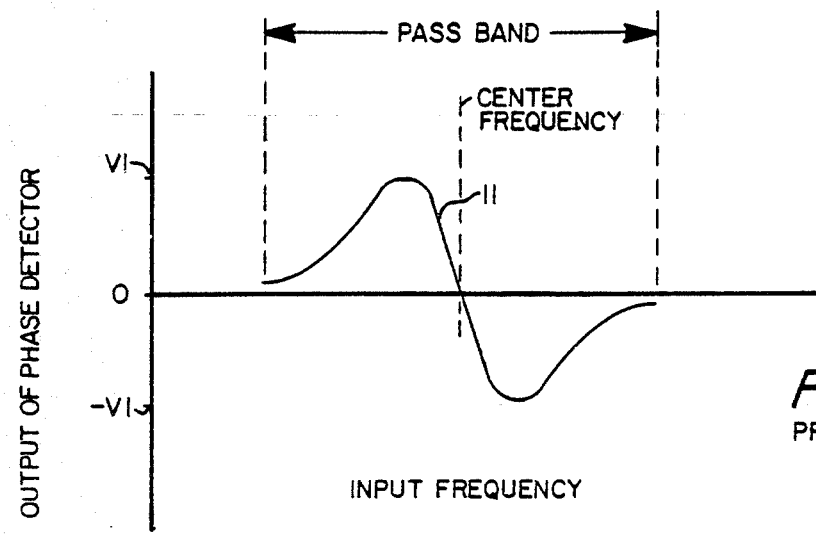
FIG. 1A is a sketch of the characteristic curve of a conventional frequency discriminator illustrating how, with an input signal of variable frequency and constant amplitude, the output of such a discriminator changes.
Figure 2:
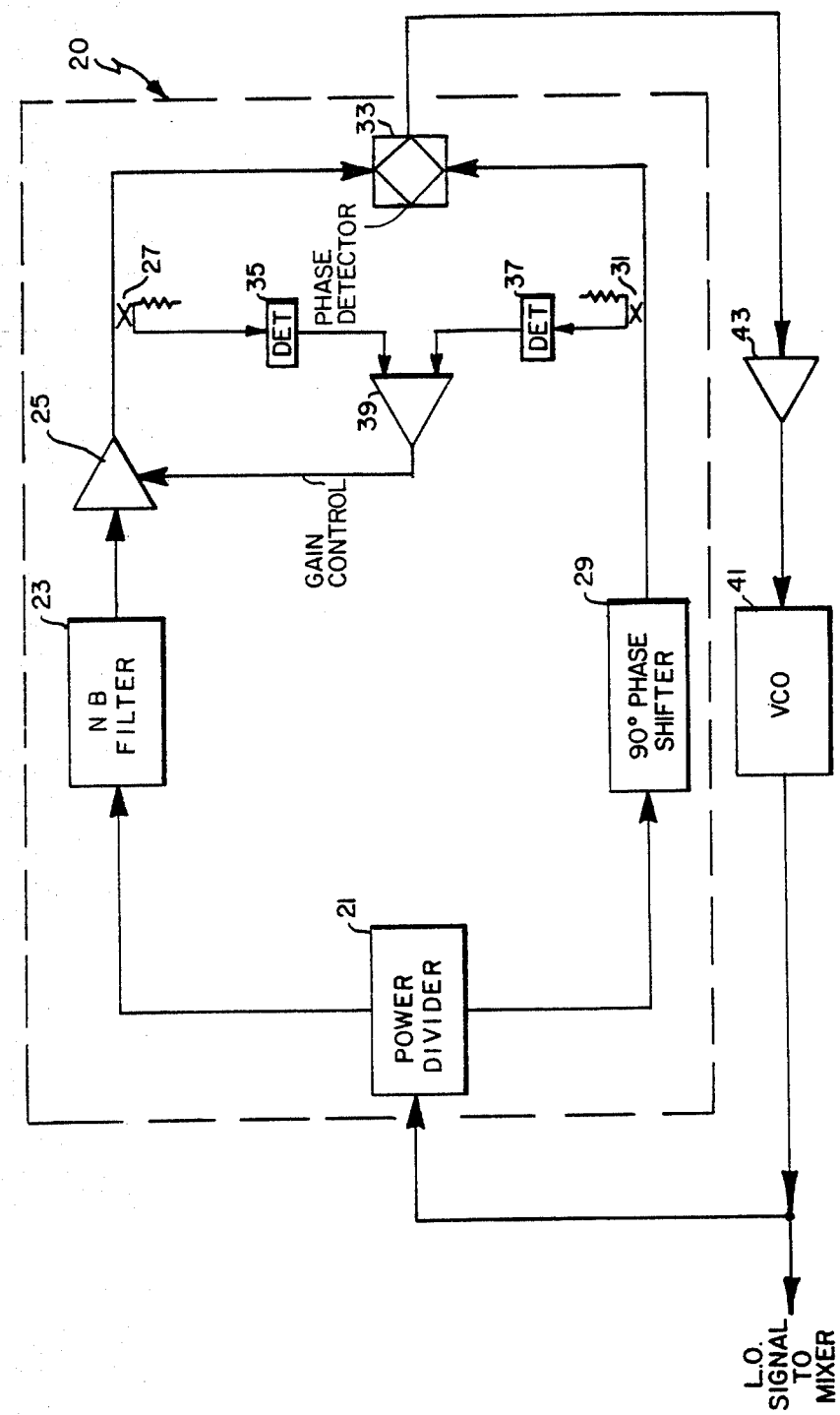
FIG. 2 is a simplified block diagram of a frequency discriminator according to this invention.

Before referring in detail to FIG. 1A, it should be noted that there are elements shown in FIG. 2 that are also incorporated in a conventional frequency discriminator. Thus, both the here-contemplated frequency discriminator and a conventional frequency discriminator incorporate a power divider to split an input signal into two channels, a tuned circuit, i.e. narrowband filter in one of the two channels, a 90° phase shifter in the second channel and a phase detector to produce a characteristic curve 11 having a polarity and amplitude ideally indicative of the frequency (relative to the center frequency of the narrowband filter) of the input signal.

It will be appreciated that the reactance of the narrow-band filter will change from an inductive reactance to a pure resistance and then to a capacitive reactance as the frequency of a signal impressed on such a filter is changed. To put it another way, the impedance of the narrowband filter (and therefore the phase shift impressed on any signal passing through such filter) changes, albeit in a nonlinear manner, with a change in frequency of the input signal. On the other hand, the impedance of the 90° phase shifter remains substantially constant with change in frequency of the input signal. Therefore, at least for input signals having a frequency in the vicinity of the center of the passband of the narrowband filter, the amplitude and polarity of the output of the phase detector is indicative of the deviation of the frequency of the input signal from the center frequency of the narrowband filter and conventional control circuitry may be employed to null such deviation. When, however, the frequency of the input signal differs substantially, i.e. when the frequency of an input signal is outside the capture band, attenuation to a degree determined by the shape of the passband of the narrowband filter, occurs. Such attenuation in turn causes a corresponding decrease in the amplitude of the signal out of the phase detector. A moment's thought will make it clear that such a decrease in amplitude will cause the conventional control circuitry to attempt to null at a frequency displaced from the actual frequency of the input signal. Further, because the amplitude of the signal out of the narrowband filter is then very much attenuated (as compared to the signal out of the 90° phase shifter), leakage of the input signal through the phase detector takes place so the control signal out of the phase detector is ambiguous.

It will now also be apparent that, if the frequency of the input signal is outside the capture band, auxiliary means (not shown) must be added to a conventional frequency discriminator to make such a discriminator effective. Thus, assuming that the width of the passband of the narrowband filter cannot be changed, it is necessary to provide means for changing the frequency of the input signal. While there are many known arrangements for implementing either means, the added complexity of any such arrangements (along with the time taken for any such arrangements to operate) obviously is detrimental.

Figure 1B:
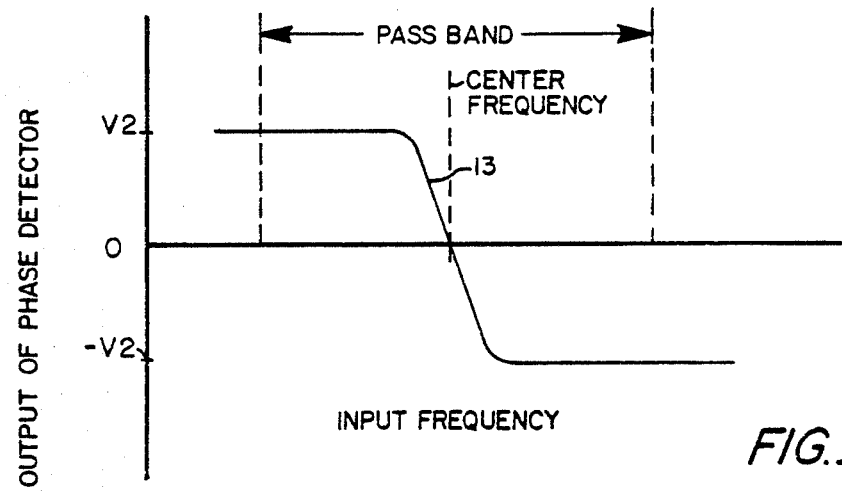
FIG. 1B is a sketch of the characteristic curve of a frequency discriminator according to this invention illustrating how, with an input signal of variable frequency and constant amplitude, the output of such a discriminator changes.

Referring now to FIG. 1B, a characteristic curve 13 for a frequency discriminator that is not subject to the limitations of a conventional frequency discriminator is shown. Thus, in FIG. 1B it will be seen that: (a) In the frequency band near the center frequency of the narrowband filter the amplitude and polarity of the control signal out of the phase detector is indicative of the frequency (relative to the center frequency of the narrowband filter) of the input signal; and (b) outside the frequency band near the center frequency of the narrowband filter the amplitude of the control signal remains at a maximum (either positive or negative). Therefore, the limitations of a conventional frequency discriminator are overcome, it being evident that the capture band of a frequency discriminator having a characteristic curve such as is illustrated in FIG. 1B would be extremely wide and no auxiliary means would be required to make such a discriminator.

Referring now to FIG. 2, a frequency discriminator 20 according to this invention provides a characteristic curve such as is illustrated in FIG. 1B. Such a discriminator is shown to include a power divider 21 to divide an input signal equally between two channels (not numbered). A narrowband filter 23, a variable gain amplifier 25 and a directional coupler 27 are connected as shown in one channel and a 90° phase shifter 29 and a directional coupler 31 are connected as shown in the second channel. The narrowband filter 23 here is an electronically tunable circuit (say a so-called "YIG filter") or some other type of resonant circuit (say a mechanically tunable or fixed-tuned resonant cavity). The variable gain amplifier 25 is conventional. The signals out of the two channels (not numbered) are fed to input terminals (not shown) of a phase detector 33 to produce a control signal for a voltage-controlled oscillator (VCO 41) via a loop shaping amplifier 43. The signal out of VCO 41 is the local oscillator signal fed into a first mixer (not shown) into which a received radio frequency signal is also fed. The signal out of the VCO 41 is also applied as the input signal to the frequency discriminator 20 in order to provide VCO noise degeneration.

The signals out of directional couplers 27, 31 are detected by detectors 35, 37, respectively, to produce input signals as inputs to a differential amplifier 39. The output signal from the latter is provided as a control signal to the variable gain amplifier 25.

The narrowband filter 23 is tuned to any frequency within a predetermined intermediate frequency band and the phase shifter 29 is adjusted to provide phase quadrature between signals at the tuned frequency passed through the two channels (not numbered). It will be appreciated then that the control signal out of the phase detector 33 will be zero when the frequency of the input signal equals the center frequency of the narrowband filter 23 and that, when the frequency of the input signal differs from the center frequency of the narrowband filter 23, the amplitude and polarity of the control signaal will change in the manner shown in FIG. 1B. Any change in the control signal out of the phase detector 33 in turn causes a change in the L.O. frequency such that the frequency of the input signal to the power divider 21 is changed ultimately to null the control signal out of the phase detector 33. That is to say, when the frequency of the input signal is near the center frequency of the narrowband filter 23, the described frequency discriminator 20 operates to null the control signal to the VCO 41 in a manner similar to the manner in which a conventional frequency discriminator operates. When, however, the frequency of the input signal initially is far different from the center frequency of the narrowband filter 23, the control signal out of the phase detector 33 then goes to a limit with a polarity such that the frequency of the VCO 41 is driven toward the center frequency of the narrowband filter 23. The foregoing operation is caused by the fact that circuitry controlling the amplitude of the signal out of the variable gain amplifier 25 (the directional couplers 27, 31, the detectors 35, 37 and the differential amplifier 39) is effective to maintain equality between the amplitudes of the signals impressed on the phase detector 33. Consequently, compensation for any change in the impedance of the narrowband filter 23 (or of the 90° phase shifter 29) is achieved so the disclosed frequency discriminator 20 is operative over a band of frequencies far exceeding the width of the passband of the narrowband filter 23.

Having described a preferred embodiment of this invention as used in a frequency tracker in a radar tracking a single target, it will be apparent to one of skill in the art that modification of the disclosed embodiment could easily be made to eliminate the effect of the presence of targets at different frequencies or to adapt the disclosed frequency discriminator to other uses. Further, the particular forms of the various elements may be changed without departing from the inventive concepts. It is felt, therefore, that this invention should not be restricted to its disclosed embodiment, but rather should be limited only by the spirit and scope of the appended claims.

What is claimed is:

1. In a frequency discriminator wherein the frequeny of a signal relative to the center frequency of a tuned circuit is to be determined by passing the signal through two channels to a phase detector, the first one of the channels incorporating the tuned circuit and the second one of the channels being arranged to shift the phase of the signal by a fixed amount independently of the frequency of the signal, the improvement comprising:
   (a) a variable gain amplifier disposed in the first one of the channels between the tuned circuit and the phase detector;
   (b) means for sensing the amplitudes of the signal out of each one of the two channels; and
   (c) means, responsive to the difference between the amplitudes of the signals out of the two channels, for producing a gain control signal applied to the variable gain amplifier to change the amplitude of the signal out of the amplifier to null the difference between the amplitudes of the signals out of the two channels.

2. The improvement as in claim 1 wherein the phase shift of the signal in the second one of the two channels is 90°.

* * * * *